United States Patent
Chen

(10) Patent No.: US 6,174,180 B1
(45) Date of Patent: Jan. 16, 2001

(54) SELF-CONTAINED LATCH/JECTOR MECHANISM FOR DATA CARD AND METHOD

(75) Inventor: Ralph R. Chen, Mill Creek, WA (US)

(73) Assignee: Intermec Technologies Corporation, Everett, WA (US)

(*) Notice: Under 35 U.S.C. 154(b), the term of this patent shall be extended for 0 days.

(21) Appl. No.: 09/059,650

(22) Filed: Apr. 13, 1998

(51) Int. Cl.[7] .................................................. H01R 13/62
(52) U.S. Cl. ............................................ 439/159; 439/328
(58) Field of Search .................................... 439/159, 328, 439/155, 160, 153, 152

(56) References Cited

U.S. PATENT DOCUMENTS

| | | | | |
|---|---|---|---|---|
| 5,302,133 | * | 4/1994 | Tondreault | 439/328 |
| 5,389,000 | * | 2/1995 | DiViesti | 439/160 |
| 5,871,365 | * | 2/1999 | Kajiura | 439/159 |
| 5,923,541 | * | 7/1999 | Yasumi | 439/159 |

* cited by examiner

*Primary Examiner*—Neil Abrams
*Assistant Examiner*—Javaid Nasri
(74) *Attorney, Agent, or Firm*—Joan H. Pauly

(57) ABSTRACT

An ejector is operable to move an ejector member against a data card in engagement with a connector to move the card along a pathway into an ejected position out of engagement with the connector. A latch member is mounted on the connector and has a blocking portion with a latch position in which it extends into the pathway to block movement of the card. The ejector includes a slide button that engages a lever to pivot the lever so that one end of the lever pushes on the card to push the card toward its ejected position. The positive latch action of the latch member prevents such movement unless the latch member is disengaged. The latch member preferably includes a leaf spring having a spring force that resists movement of its free outer end from a blocking position. A projection on the spring may be engaged to depress the spring into an unlatch position.

17 Claims, 3 Drawing Sheets

SELF-CONTAINED LATCH/JECTOR MECHANISM FOR DATA CARD AND METHOD

TECHNICAL FIELD

This invention relates to the engagement of data cards with connectors and the ejection of the cards from the engaged position. It more particularly relates to a system of preventing unintended disengagement by mounting a latch member on the connector and biasing a blocking portion of the latch member into a pathway along which an ejector moves the card into an ejected position.

BACKGROUND INFORMATION

Data cards, such as compact flash cards, are used in various types of electronic devices. Such devices include notebook computers and various types of devices for reading bar codes and other symbologies. The reading devices include hand-held scanners and digital cameras. In hand-held bar code scanners, bar code data may be stored in a compact flash card preparatory to transfer to a host computer. The transfer may occur by wireless communication, i.e. radio frequency communication, an infrared signal, or use of a modem. Digital cameras are sometimes used for reading two-dimensional symbologies, which are in effect a two-dimensional version of the standard one-dimensional bar code. Digital cameras are also used for broader purposes, such as high quality photography of subjects unrelated to bar codes. In digital cameras, the picture may be stored in a compact flash card and later transferred to a computer for editing and printing. Compact flash cards and other types of data cards have a variety of known uses in notebook computers.

A problem that has been encountered in connection with the use of data cards is the inadvertent loss of data stored on the card. For example, a hand-held device might be dropped or in some other manner subjected to a shock during use of the device. The shock can cause unintended disconnection of the card from its connector. If the disconnection occurs during a card memory writing process, the entire memory will be erased. This results in data loss and the added expense of personnel time spent in recollecting the data. In some situations, it may not be possible to recollect the data. For example, in a warehouse environment, the data might include the identification of shipping units that have left the warehouse and are on their way to their destinations.

Currently available mounting mechanisms for data cards in hand-held bar code scanners and digital cameras have the drawback of not providing for protection against unintended disconnection of the data card when the device is subjected to shock, vibrations, or even an unintentional pull on the card. The conception of the present invention began with the applicant's recognition of the need for a mechanism that would prevent unintended disengagement of a data card from its connector and also allow or facilitate ejection of the card when removal is desired.

SUMMARY OF THE INVENTION

A subject of the invention is an ejector and latch mechanism for a data card inserted in a device and releasably engaging a connector mounted in the device. As used herein, the term "device" is intended to include various types of devices including but not limited to hand-held bar code scanners, digital cameras, notebook computers, and any other hand-held devices which utilize data cards. The term "data card" includes compact flash cards, modem cards, memory cards, radio and other communications cards, and similar cards used in devices having electronic components.

According to an aspect of the invention, the mechanism comprises an ejector and a latch member. The ejector is operable to move an ejector member against a data card in engagement with the connector, to move the card along a pathway into an ejected position out of engagement with the connector. The latch member is mounted on the connector and has a blocking portion. The blocking portion has a latch position in which it extends into the pathway to block movement of the card out of engagement with the connector. It also has an unlatch position in which it is clear of the pathway to allow the card to move out of engagement with the connector into the ejected position.

Preferably, the blocking portion is biased into the latch position. The preferred form of the blocking portion comprises a leaf spring having a spring force that resists movement from the latch position to the unlatch position. A preferred feature is a latch member having a projection extending from the leaf spring and configured to be engaged by an operator to depress the leaf spring into the unlatch position.

The ejector portion of the combination preferably includes an ejector slide button slidably mounted on the connector. In embodiments in which the latch member includes a leaf spring with a projection thereon, the slide button is preferably mounted inwardly of and adjacent to the projection. In any case, the latch member or, if applicable, the leaf spring is preferably attached to the slide button to slide therewith. The slide button is engageable by an operator to slide the slide button inwardly.

In the preferred form of the ejector, the ejector member comprises a pivotally mounted lever having first and second ends and a pivot point between the ends. The lever is positioned so that the slide button engages the first end of the lever to move the first end inwardly as the slide button moves inwardly to cause the lever to pivot about its pivot point. As the lever pivots, its second end moves against the card to push the card outwardly into its ejected position.

According to another aspect of the invention, the mechanism comprises an ejector and a latch member. The ejector is operable to move the card along the pathway into an ejected position out of engagement with the connector. When not in operation, the ejector allows the card to move along the pathway toward the ejected position in response to an external shock. The latch member is mounted on the connector. It operates automatically to block movement of the card out of engagement with the connector, to provide a position latch action to maintain the card in engagement with the connector. The latch member is operable to disengage the positive latch action to allow the card to move out of engagement with the connector into the ejected position.

The preferred forms of the structures of the latch member and ejector are discussed above. The ejector preferably comprises a lever and a slide button. When an operator attempts to operate the ejector by sliding the slide button without disengaging the latch member, the positive latch action blocks movement of the card and thereby blocks sliding of the slide button and pivoting of the lever.

Another subject of the invention is a method of preventing unintended disengagement of a data card from a connector mounted in a device and allowing desired removal of the card. The device has an ejector that is operable to move the card along a pathway into an ejected position out of engagement with the connector. When not in operation, it allows the card to move along the pathway toward the ejected position in response to an external shock. According to an aspect of the invention, the method comprises mounting a latch member on the connector. A blocking portion of the latch member is biased into the pathway. When it is desired to remove the card from the device, the blocking portion is manually moved into an unlatch position out of the pathway. With the blocking portion in the unlatch position, the ejector is operated to move the card into the ejected position. The method is preferably practiced using the preferred forms of the ejector and latch member described above.

The apparatus and method of the invention solve the problem discussed above of unintended disengagement of data cards and possible consequent loss of data. The invention provides a positive interlock between the card and its connector. Therefore, disconnection of the card from the connector is prevented even if there is movement of the connector relative to other portions of the device. The invention thus provides effective and reliable protection against unintended disengagement of the card and consequent loss of data and added operator time and effort.

The advantages and features discussed above and other advantages and features will become apparent from the detailed description of the best mode for carrying out the invention that follows.

BRIEF DESCRIPTION OF THE DRAWINGS

In the drawings, like element designations refer to like parts throughout, and.

BEST MODE FOR CARRYING OUT THE INVENTION

Figure 1:
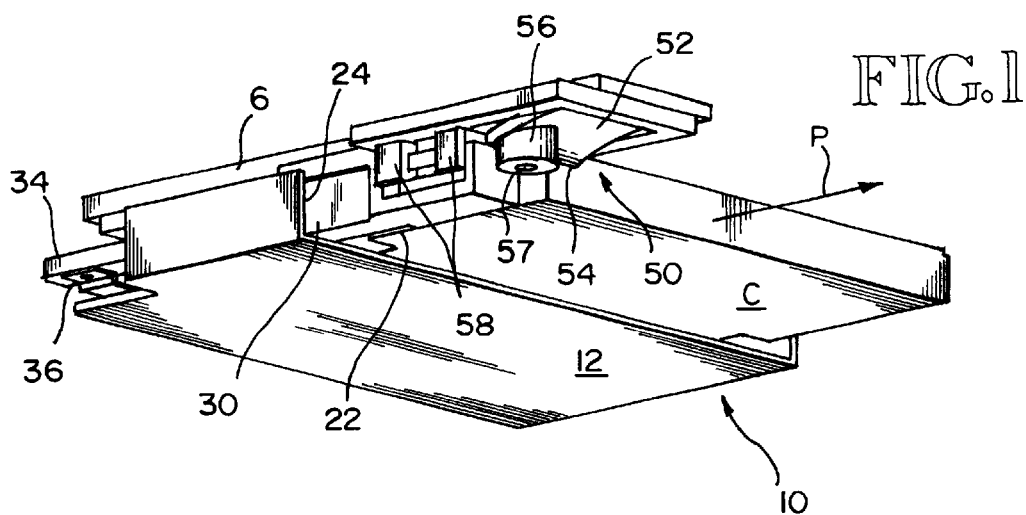
FIG. 1 is a pictorial view looking toward the bottom and one side of the preferred embodiment of the invention mounted on a connector that is mounted on a printed circuit board (PCB), showing a data card in a latched position.
Figure 2:
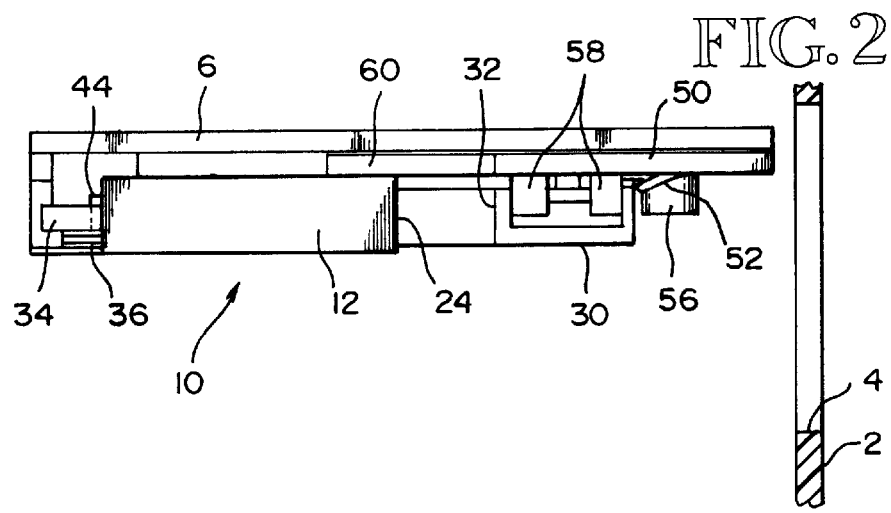
FIG. 2 is a side elevational view of the apparatus shown in FIG. 1 and a portion of a device in which the apparatus is mounted.

The drawings show apparatus that is constructed according to the invention and that also constitutes the best mode for carrying out the invention currently known to the applicant. In FIG. 2, a portion of a device 2 into which the invention may be incorporated is shown. The device may be, for example, a pistol grip type of hand-held bar code scanner with an access opening 4 for a data card C. The opening 4 may be provided with a door or cover (not shown) in a known manner. FIGS. 1–9 also illustrate in a generic manner a printed circuit board 6 mounted inside the device 2. The board 6 may be of various known types used in the particular type of device.

Figure 6:
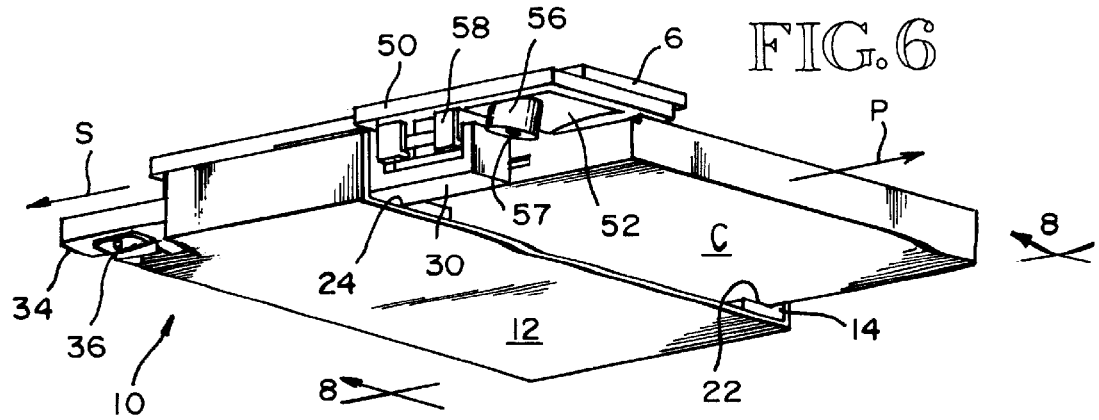
FIG. 6 is a pictorial view like FIG. 1 but showing the card in its ejected position.
Figure 7:
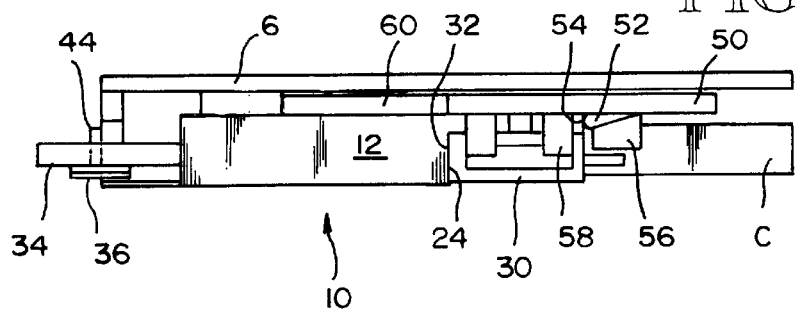
FIG. 7 is a side elevational view of the apparatus shown in FIG. 6.
Figure 8:
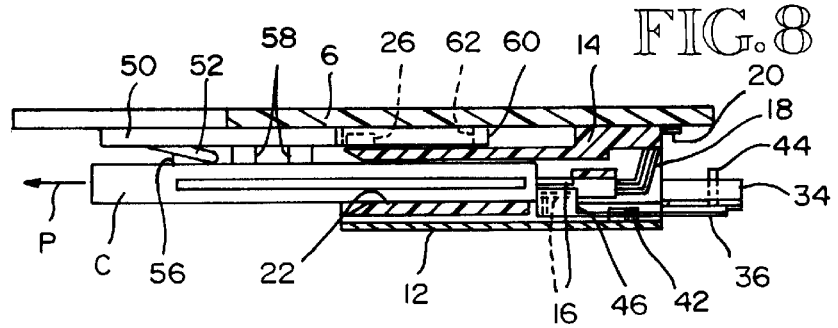
FIG. 8 is a sectional view taken substantially along the line 8—8 in FIG. 6.
Figure 9:
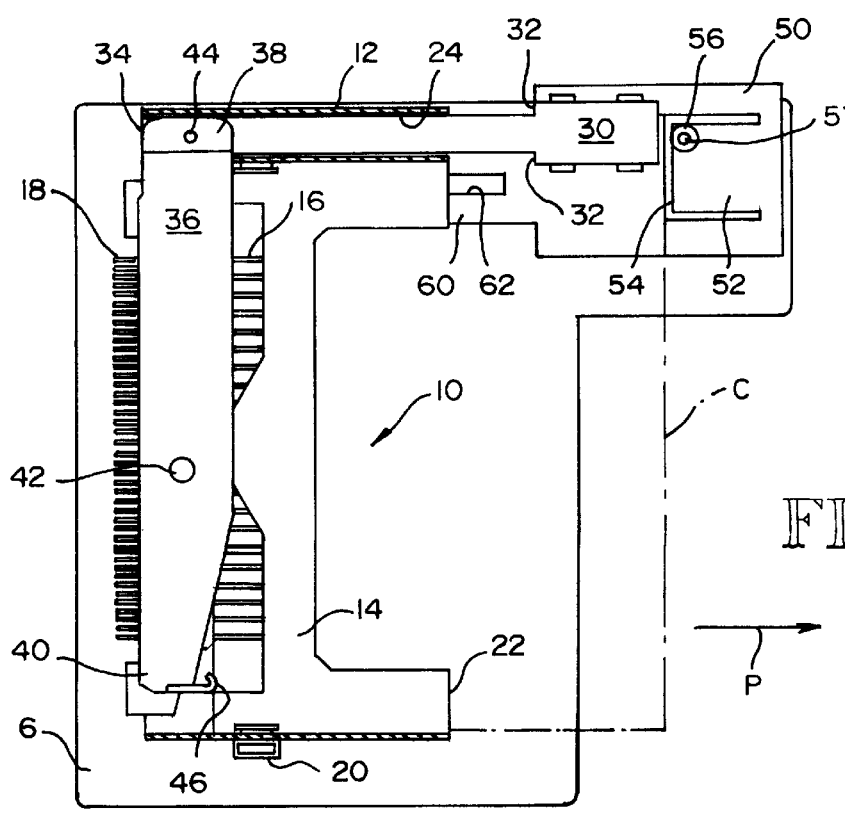
FIG. 9 is a top plan view of the ejector and latch mechanism in the latch position shown in FIGS. 1–3 with top portions of the connector housing omitted to better illustrate the mechanism.

A connector 10 for a data card C is secured to the circuit board 6 for releasably engaging the data card C and thereby releasably mounting it in the device 2. As shown in FIGS. 1–7 and partially in FIGS. 8 and 9, the connector 10 includes a housing 12 having a flat lower portion and two opposite sides extending upwardly and perpendicularly from the lower portion. The connector 10 also includes a pin mount 14 that is received between the two opposite sides of the housing 12. The pin mount 14 is secured to the circuit board 6, such as by a pair of screws (not shown). The housing 12 preferably is snap fit onto the pin mount 14 to permit disassembly of the portions of the connector 10. The pin mount 14 may include one or more clips 20 to help secure the connection between the housing 12 and the pin mount 14. Referring to FIGS. 8 and 9, two sets of pins 16, 18 are carried by the pin mount 14. The first set of pins 16 extends forwardly into a card slot 22 for engaging corresponding sockets in a data card C. The second set of pins 18 extends rearwardly from the connector 10 to provide electrical connections to other components of the device 2.

The purpose of the connector 10 is to receive a data card C and provide releasable electrical connection of the card C to other components of the device 2. For this purpose, the connector 10 includes the card slot 22 mentioned above. The slot 22 is defined by the pin mount 14 and is configured to closely receive the card C. The card pins 16 extend into the rear of the slot 22 to engage corresponding sockets on the rear edge of the card C. The connector 10 also includes a side slideway 24 formed by the housing 12 laterally adjacent to the card slot 22. The slideway 24 receives and guides a portion of the ejector mechanism, as described below. According to the invention, the connector 10 includes an additional element for connection to the latch portion of the mechanism. This element is a tab 26, shown in FIG. 8, that extends upwardly from a side portion of the connector housing 12 to engage a slot 62 in the latch, as described below.

Figure 3:
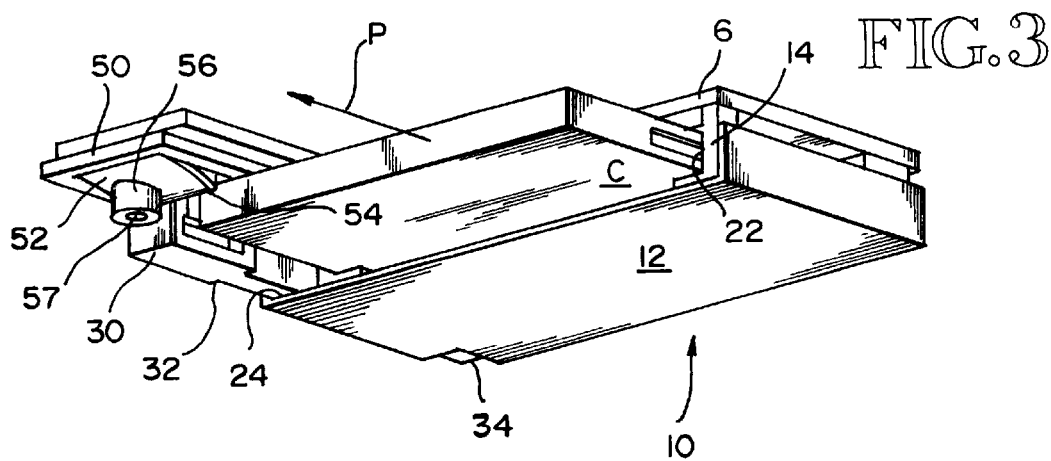
FIG. 3 is a pictorial view of the apparatus shown in FIG. 1 looking toward the front and opposite side of the apparatus.
Figure 4:
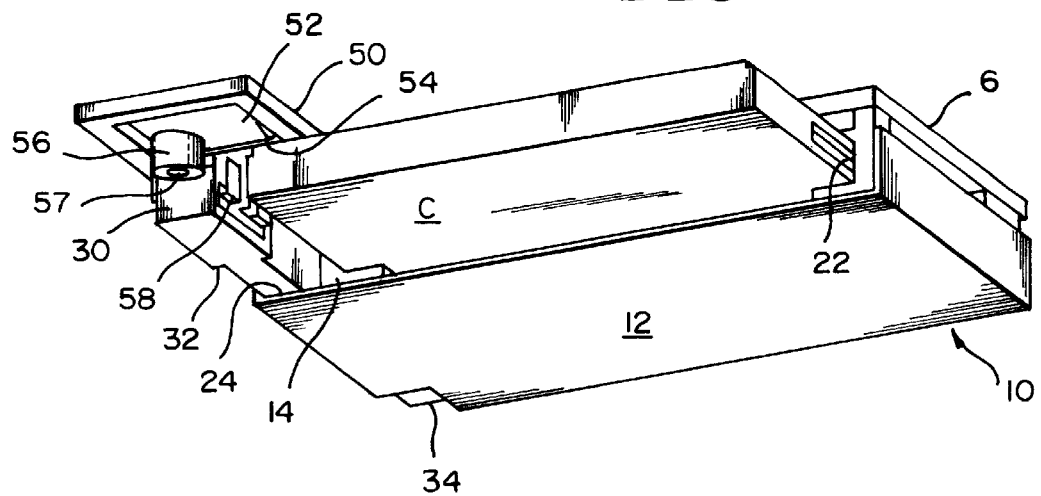
FIG. 4 is like FIG. 3 except that it shows the unlatch position of the blocking portion of the latch member.
Figure 5:
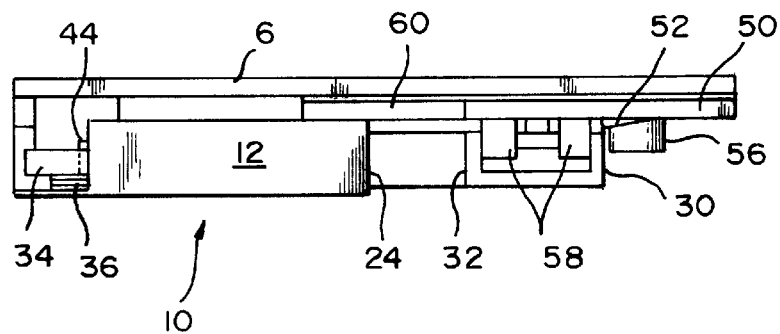
FIG. 5 is a side elevational view of the apparatus shown in FIG. 4.

The apparatus of the invention includes the combination of an ejector and a latch member. The ejector is operable to move an ejector member against a data card C in engagement with the connector 10, to move the card C along a pathway P into an ejected position out of engagement with the connector 10. FIGS. 1–3 illustrate the engaged latched position of the card C. FIGS. 4 and 5 illustrate the engaged but unlatched position. FIGS. 6–8 show the ejected position. FIG. 9 shows in broken lines a card C engaged in the card slot 22. In the engaged position shown in FIGS. 1–5 and 9, the card pins 16 carried by the pin mount 14 of the connector 10 extend into the corresponding sockets at the rear of the card C. As the card C moves toward its ejected position along the pathway P illustrated by the arrows P in FIGS. 1, 3, 6, 8, and 9, the pins 16 move out of the sockets to break the electrical connection between the card C and the connector 10. This creates a "disengagement" of the card C from the connector 10 within the meaning of that term as used herein.

The ejector includes an elongated ejector slide button 30 slidably mounted on the connector 10. The slide button 30 is slidably received in the side slideway 24 formed by the connector housing 12. The outer or forward end of the slide button 30 has an increased width to form laterally opposite shoulders 32. These shoulders 32 engage the upstanding sidewalls of the side slideway 24 to limit inward sliding movement of the slide button 30 relative to the connector 10. The opposite inner end 34 of the slide button 30 engages a first end 38 of a laterally extending lever 36. Preferably, the slide button inner end 34 is pin connected to the lever end 38 to provide a pivotal connection therebetween. The lever 36 has a second opposite free end 40 and a pivot point 42 between the two ends 38, 40. The lever 36 is attached to the connector housing 12 at the pivot point 42 to pivotally mount the lever 36 on the connector 10.

The pin connector 44 that provides the pivotal connection of the first end 38 of the lever 36 to the slide button 30 projects upwardly beyond the slide button end 34, as shown in FIGS. 2, 5, 7, and 8. The upstanding projecting end of the pin connector 44 provides an inner stop for movement of the slide button 30. The pin connector 44 limits outward sliding movement of the slide button 30 by engaging an upper wall of the slideway 24 when the slide button 30 reaches the limits of its outward sliding movement.

When the slide button 30 is moved inwardly by an operator in the direction indicated by the arrow S in FIG. 6, the connection of the inner end 34 of the button 30 to the first end 38 of the lever 36 causes the lever 36 to pivot about its pivot point 42. The pivoting of the lever 36 causes the opposite free end 40 to move against a card C in the card slot 22. The free end 40 carries an abutment 46 that engages the card C to push the card C outwardly toward its ejected position. As can be seen in FIGS. 8 and 9, the abutment 46 has a generally J-shaped configuration and projects forwardly and upwardly from the lever 36 to engage the card C.

As can be understood from an examination of the drawings and the foregoing description, the structure of the ejector is such that, when the ejector is not being operated to eject the card C, it allows the card C to move along the pathway P toward the ejected position in response to an external shock. In other words, the ejector does not include any structural or functional elements that would prevent such movement. Therefore, in accordance with the invention, the ejector is provided in combination with a latch member 50 in order to prevent unintended disengagement of a card C from the connector 10. The latch member of the invention may be added to a preexisting ejector mechanism which allows unintended disconnection. Alternatively, the ejector and latch member may be manufactured as a single integrated mechanism as part of the original design of a device.

An important feature of the invention is the mounting of the latch member on the connector to provide a positive interlock between the latch member and the connector and prevent movement of the card C relative to the connector even when the connector moves relative to other components of the device in which the mechanism of the invention is mounted. The illustrated preferred embodiment of the latch member 50 includes a leaf spring 52 having a free end 54 that forms a blocking portion of the latch member 50. The free end 54 has a latch position, shown in FIGS. 1–3, in which it extends into the pathway P to block movement of the card C out of engagement with the connector 10. It also has an unlatch position, shown in FIGS. 4 and 5, in which it is clear of the pathway P to allow the card C to move out of engagement with the connector 10 and into the ejected position. The leaf spring 52 has a spring force that resists movement of the free end 54 thereof from the latch position to the unlatch position. In accordance with the invention, the latch member could be provided with a blocking portion having a structure other than the free end of a leaf spring. Regardless of the form of the blocking portion, it is desirable that it be biased into the latched position.

The biasing of the blocking portion into the pathway P provides a positive latch action that operates automatically to maintain the card C in engagement with the connector 10. The positive latch action also blocks sliding of the slide button 30 and pivoting of the lever 36 to prevent unintended operation of the ejector. The latch member is operable to disengage the positive latch action to allow the ejector to operate and the card C to move out of engagement with the connector 10 into the ejected position. In the illustrated preferred embodiment, the latch member is operated to disengage the latch action by means of a projection 56 extending downwardly from the leaf spring 52 laterally adjacent to but clear of the pathway P of the card C. Preferably, the projection 56 is positioned outwardly of and adjacent to the outer end of the slide button 30. The projection 56 is configured to be engaged by an operator to depress the leaf spring 52 into the unlatch position shown in FIGS. 5 and 6. To facilitate engagement by an operator, the substantially cylindrical projection 56 is provided with a center axial opening 57 extending into the projection 56 from its lower radial surface. To engage the projection 56 and disengage the latch action, an operator may insert the point of a pen or pencil in the hole 57 and push on the pen or pencil to push on the projection 56 and depress the spring 52.

As noted above, the latch member 50 is mounted on the connector 10 in accordance with the invention. Preferably, the latch member 50 is slidably mounted on the connector 10 and is attached to the slide button 30 to slide therewith. The latch member 50 is substantially flat and has a generally T-shaped configuration, shown in plan in FIG. 9. The leaf spring 52 is formed by a U-shaped cut in the outer enlarged width portion of the latch member 50 that defines a flap which forms the leaf spring 52. Inwardly of the leaf spring 52, the body of the latch member 50 has two opposite pairs of downwardly extending attachment tabs 58. These tabs 58 serve to connect the latch member 50 to the slide button 30. The narrow width rear portion 60 of the latch member 50 has a rearwardly or inwardly extending slot 62 extending vertically therethrough. This slot 62 receives the tab 26 carried by the pin mount 14 of the connector 10, as described above. The engagement of the tab 26 in the slot 62 helps to guide sliding movement of the latch member 50 and the slide button 30.

The connection of the latch member 50 to the slide button 30 permits the unlatching and ejecting operation to be performed essentially as a single movement. An operator inserts the tip of a pen or pencil into the hole 57 in the latch member projection 56 and pushes on the projection 56 to depress the leaf spring 52. At the same time, the operator pushes inwardly on the pen to slide the latch member 50 and attached slide button 30 inwardly as soon as the leaf spring 52 clears the card C. When the card C has been moved into the ejected position illustrated in FIGS. 6–8, the operator may grasp the card C and completely remove it from the connector 10.

As used herein, the terms "upwardly", "downwardly", and the like are used to facilitate description of the invention and to refer to the orientation of the apparatus shown in the drawings. They are not intended as a limitation on the use orientation of the apparatus of the invention. It is intended to be understood that the apparatus of the invention may be used in various orientations other than that shown in the drawings.

Although the preferred embodiment of the invention has been illustrated and described herein, it is intended to be understood by those skilled in the art that various modifications and omissions in form and detail may be made without departing from the spirit and scope of the invention as defined by the following claims.

What is claimed is:

1. An ejector and latch mechanism for a data card inserted in a device and releasably engaging a connector mounted in the device, comprising:

an ejector operable to move an ejector member against a data card in engagement with the connector, to move the card along a pathway into an elected position out of engagement with the connector; and a latch member mounted on the connector and having a blocking portion with a latch position in which it extends into said pathway to block movement of the card out of engagement with the connector, and an unlatch position in which it is clear of said pathway to allow the card to move out of engagement with the connector into said ejected position;

in which said blocking portion is biased into said latch position; and in which said blocking portion comprises a leaf spring having a spring force that resists movement from said latch position to said unlatch position.

2. The mechanism of claim 1, in which said latch member includes a projection extending from said leaf spring and engageable by an operator to depress said leaf spring into said unlatch position.

3. The mechanism of claim 2, in which said ejector includes an ejector slide button slidably mounted on the connector inwardly of and adjacent to said projection and engageable by an operator to slide said slide button inwardly, and said ejector member comprises a pivotally mounted lever having first and second ends and a pivot point between said ends, said lever being positioned so that said slide button engages said first end to move said first end inwardly as said slide button moves inwardly, to cause said lever to pivot about its pivot point and said second end to move against the card to push the card outwardly into said ejected position.

4. The mechanism of claim 3, in which said leaf spring is attached to said slide button to slide therewith.

5. The mechanism of claim 1, in which said ejector includes an ejector slide button slidably mounted on the connector and engageable by an operator to slide said slide button inwardly, and said ejector member comprises a pivotally mounted lever having first and second ends and a pivot point between said ends, said lever being positioned so that said slide button engages said first end to move said first end inwardly as said slide button moves inwardly, to cause said lever to pivot about its pivot point and said second end to move against the card to push the card outwardly into said ejected position.

6. The mechanism of claim 5, in which said latch member is attached to said slide button to slide therewith.

7. The mechanism of claim 1, in which said ejector includes an ejector slide button slidably mounted on the connector and engageable by an operator to slide said slide button inwardly, and said ejector member comprises a pivotally mounted lever having first and second ends and a pivot point between said ends, said lever being positioned so that said slide button engages said first end to move said first end inwardly as said slide button moves inwardly, to cause said lever to pivot about its pivot point and said second end to move against the card to push the card outwardly into said ejected position.

8. The mechanism of claim 7, in which said leaf spring is attached to said slide button to slide therewith.

9. The mechanism of claim 2, in which said ejector includes an ejector slide button slidably mounted on the connector inwardly of and adjacent to said projection, and said leaf spring is attached to said slide button to slide therewith.

10. The mechanism of claim 1, in which said ejector includes an ejector slide button slidably mounted on the connector, and said latch member is attached to said slide button to slide therewith.

11. An ejector and latch mechanism for a data card inserted in a device and releasably engaging a connector mounted in the device, comprising:

an ejector operable to move the card along a pathway into an ejected position out of engagement with the connector;

a latch member mounted on the connector; said latch member operating automatically to block movement of the card out of engagement with the connector, to provide a positive latch action to maintain the card in engagement with the connector, and said latch member being operable to disengage said positive latch action to allow the card to move out of engagement with the connector into said ejected position;

said elector, when not in operation, by itself and without said latch member, allowing the card to move along said pathway toward said ejected position in response to an external shock;

in which said latch member includes a blocking portion that is biased to extend into said pathway; and in which said blocking member comprises a leaf spring having a spring force that resists movement out of said pathway into an unlatch position.

12. The mechanism of claim 11, in which said latch member includes a projection extending from said leaf spring and configured to be engaged by an operator to depress said leaf spring into said unlatch position.

13. The mechanism of claim 12, in which said ejector includes an ejector slide button slidably mounted on the connector inwardly of and adjacent to said projection, and said leaf spring is attached to said slide button to slide therewith.

14. The mechanism of claim 11, in which said ejector includes an ejector slide button slidably mounted on the connector, and said latch member is attached to said slide button to slide therewith.

15. The mechanism of claim 14, in which said ejector comprises a lever pivotally mounted to pivot, when said ejector slide button slides, to move an end portion of said lever against the card to push the card out of engagement with the connector and into said ejected position; said positive latch action blocking movement of the card and thereby blocking sliding of said slide button and pivoting of said lever.

16. A latch mechanism for a data card inserted in a device and releasably engaging a connector mounted in the device, the card being movable along a pathway into a disconnected position out of engagement with the connector, comprising:

a latch member mounted adjacent to said pathway and having a blocking portion with a latch position in which it extends into said pathway to block movement of the card out of engagement with the connector, and an unlatch position in which it is clear of said pathway to allow the card to move out of engagement with the connector into said disconnected position;

in which said blocking portion is biased into said latch position; and in which said blocking portion comprises a leaf spring having a spring force that resists movement from said latch position to said unlatch position.

17. The mechanism of claim 16, in which, in said latch position, said blocking portion engages an end surface of the card opposite the connector.

* * * * *

UNITED STATES PATENT AND TRADEMARK OFFICE
CERTIFICATE OF CORRECTION

PATENT NO.    : 6,174,180 B1
DATED         : January 16, 2001
INVENTOR(S)   : Ralph R. Chen It is certified that error appears in the above-identified patent and that said Letters Patent is hereby corrected as shown below:

<u>Title page, Item [54] and Column 1, line 1,</u>
"LATCH/JECTOR" should be -- LATCH/EJECTOR --

<u>Column 7,</u>
Line 10, "elected" should be -- ejected --

<u>Column 8,</u>
Line 26, "elector" should be -- ejector --

Signed and Sealed this

Twenty-eighth Day of January, 2003

JAMES E. ROGAN
*Director of the United States Patent and Trademark Office*